United States Patent
Kato

[19]

[11] Patent Number: 6,003,381

[45] Date of Patent: Dec. 21, 1999

[54] PRESSURE SENSOR

[75] Inventor: Hajime Kato, Tokyo, Japan

[73] Assignee: Mitsubishi Denki Kabushiki Kaisha, Tokyo, Japan

[21] Appl. No.: 09/277,767

[22] Filed: Mar. 29, 1999

[30] Foreign Application Priority Data

Oct. 16, 1998 [JP] Japan .................................. 10-295223

[51] Int. Cl.⁶ .................................. G01L 9/06; G01L 7/08
[52] U.S. Cl. .......................................................... 73/721
[58] Field of Search ............................ 73/715, 717, 718, 73/719, 720, 756, 708, 721

[56] References Cited

U.S. PATENT DOCUMENTS

| | | | |
|---|---|---|---|
| 5,448,444 | 9/1995 | Provenzano et al. | 361/283.4 |
| 5,515,732 | 5/1996 | Willcox et al. | 73/724 |
| 5,635,649 | 6/1997 | Tobita et al. | 73/717 |

FOREIGN PATENT DOCUMENTS 57-186138  11/1982  Japan .

*Primary Examiner*—Benjamin R. Fuller
*Assistant Examiner*—Abdullahi Aw-Musse
*Attorney, Agent, or Firm*—Oblon, Spivak, McClelland, Maier & Neustadt, P.C.

[57] ABSTRACT

A pressure sensor including a pressure sensor element, a pedestal having a through-hole defined therein for guiding an external pressure to the pressure sensor element and a header, all of which are successively tightly bonded together. The pressure sensor also includes a cap for covering the pressure sensor element and the pedestal and mounted tightly on the header. A region of the header ranging from a joint between the cap and the header to a joint between the pedestal and the header is stepped.

4 Claims, 6 Drawing Sheets

PRESSURE SENSOR

BACKGROUND OF THE INVENTION

1. Field of the Invention

The present invention generally relates to a pressure sensor and, more particularly, to the pressure sensor which can be used in association with an automobile engine control or the like.

2. Description of the Prior Art

The pressure sensor has too many applications and, as far as the automobile is concerned, the pressure sensor is used in, for example, airflow measurement for a fuel injection, control of a hydraulic fluid in an automobile suspension system and/or monitoring of an internal pressure inside a gas tank. The pressure sensor is also used in, for example, a household gas leakage alarming system.

Figure 7:
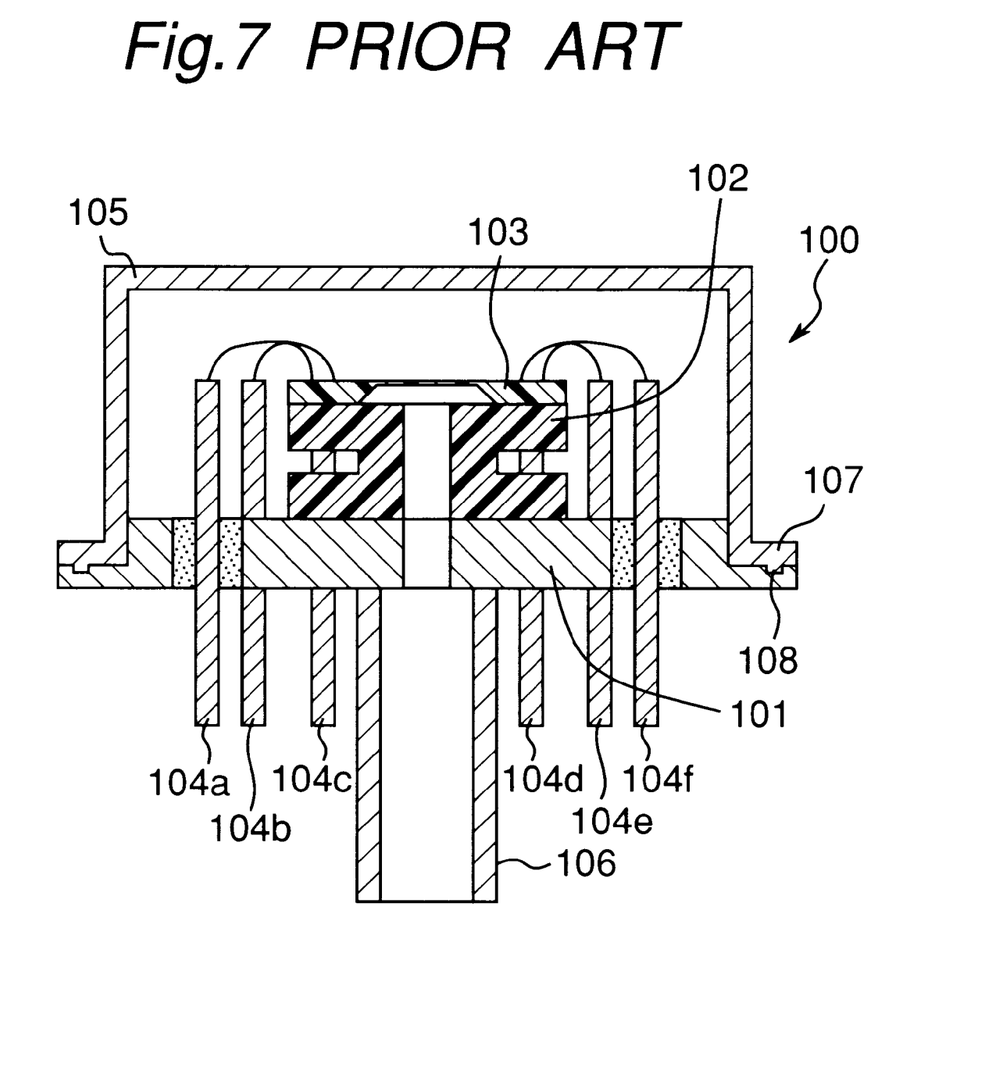
FIG. 7 is a schematic side sectional view of the prior art pressure sensor.

FIG. 7 illustrates a schematic side sectional representation of the prior art pressure sensor 100. This known pressure sensor 100 includes a pressure sensor element 103 of a piezoelectric-resistance type having a cavity defined inwardly from an undersurface thereof to thereby define an upper surface region serving as a pressure receiving surface. This pressure receiving surface is provided with piezoelectric resistance elements electrically connected in a Wheatstone bridge circuit. This pressure sensor element 103 has a plurality of terminals including supply terminals fed with a power source voltage, ground terminals and output terminals and is operable to convert the pressure, applied to the pressure receiving surface, into a predetermined signal which is subsequently outputted to the outside of the pressure sensor 100 through one of electrodes 104a to 104f that is wire-bonded with the output terminals.

As shown in FIG. 7, the pressure sensor element 103 is air-tightly bonded, by the use of, for example, a die-bonding technique, to a silicon pedestal 102 having a through-hole defined therein so as to open at the pressure receiving surface. The silicon pedestal 102 functions as a cushioning material for buffering stresses developed between the pressure sensor element 103 and a header 101, to thereby protect the pressure sensor element 103. This header 101 has an opening defined in alignment with the through-hole and is air-tightly bonded to the header 101 through an Au—Si junction. The header 101 is made of a 42 alloy having a coefficient of thermal expansion which is about equal to that of the silicon pedestal 102. An external pressure guiding pipe 106 is inserted in the opening in the header 101 so that a predetermined pressure medium can be guided therethrough to the pressure receiving surface of the pressure sensor element 103. A cap 105 made of SPC (cold-rolled steel plate) and having a radially outwardly protruding flange 107 is capped onto the header 101 with the flange 107 welded thereto to establish an evacuated compartment inside the resultant package. The pressure inside the evacuated compartment provides a reference pressure for the pressure sensor element 103.

As described above, the cap 105 is capped onto the header 101 during the manufacture of the pressure sensor 100. It has, however, found that during the welding of the cap 105 to the header 101, the header 101 is susceptible to deformation because of the reason which will now be discussed.

Figure 8A:
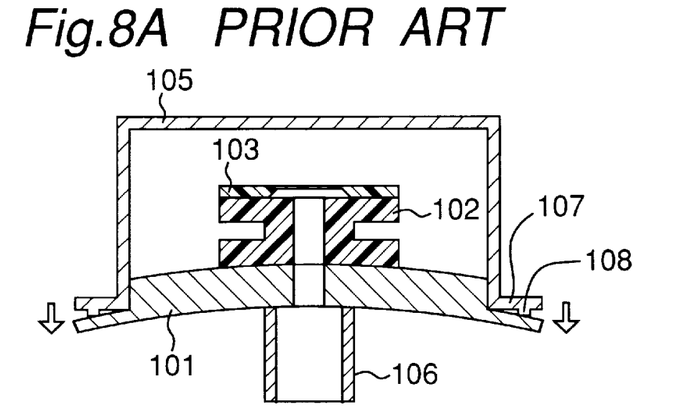
FIGS. 8A to 8C are views similar to FIG. 7, showing how the header used in the prior art pressure sensor is deformed during capping of the cap onto the header.
Figure 8B:
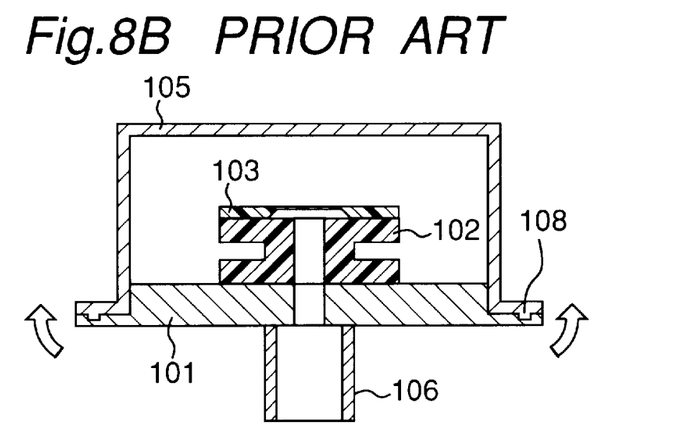
Figure 8C:
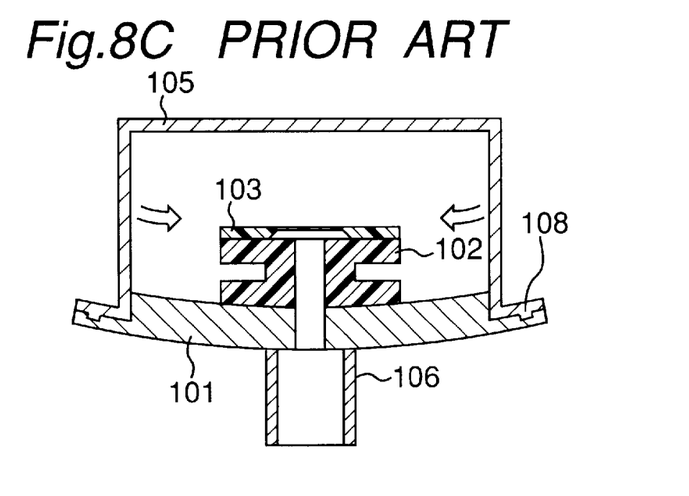

FIGS. 8A to 8C illustrates the header 101 being deformed during the course of welding of the cap 105 to the header 101, the deformation being shown exaggerated for the sake of clarity. At the outset, within a vacuum chamber, the cap 105 is capped onto the header 101 and is kept pressed against the header 101. As shown in FIG. 8A, due to the pressure applied to the header 101 through an annular projection integral with the flange 107 of the cap 105, the header 101 is deformed to assume a generally upwardly curved configuration.

Welding of the flange 107 of the cap 105 to the header 101 takes place while the header 105 is so deformed as shown in FIG. 8A. As shown in FIG. 8B, the deformation diminishes after completion of the welding.

After the welding of the cap 105 to the header 101 both of the header 101 and the cap 105 heated during the welding undergo constriction and restore to the original shape consequent upon lowering of the temperature thereof. Since the coefficient of thermal expansion of the cap 105 made of SPC is greater than that of the header 101 made of the 42 alloy, the cap 105 constricts a substantial amount greater than that exhibited by the header 101 incident to lowering of the temperature thereof. As a result of the constriction of the cap 105, the header 101 is again deformed as shown in FIG. 8C to assume a generally downwardly curved configuration.

When the deformation of the header 101 occurring during the welding is transmitted to the pressure sensor element 103 through the silicon pedestal 102, the piezoelectric resistance of the pressure sensor element 103 changes, accompanied by an undesirable change in operating characteristics of the pressure sensor element 103. Also, depending on the magnitude of deformation of the header 101, the header 101 may separate from the silicon pedestal 102 and/or cracking may occur in at least a portion of he silicon pedestal 102. In such case, the pressure inside the evacuated compartment that is used as the reference pressure may change to such an extent that an accurate pressure measurement is no longer possible.

By way of example, let it be assumed that the known pressure sensor 10 is installed in the vicinity of an automobile engine. In such case, the cap 105 will undergo a thermal expansion during the engine being operated, but undergoes a thermal shrinkage to restore to the original shape when and after the engine is halted. Not only is the header 101 deformed following the thermal expansion and shrinkage of the cap 105, but the header 101 is also deformed during the operation of the engine under the influence of engine vibrations transmitted thereto through the external pressure guiding pipe 106.

Once the header 101 is deformed in the manner described above, an undesirable change may occur in operating characteristics of the pressure sensor element 103 and/or the silicon pedestal 102 may separate from the header 101. This in turn leads to change in pressure inside the evacuated compartment that is used as the reference pressure, to such an extent that an accurate pressure measurement is no longer possible.

To lessen the adverse influence brought on the pressure sensor element by the deformation of the header, the Japanese Patent Laid-open Publication No. 57-186138 discloses the pressure sensor in which a flexible tube is disposed between the header and the silicon pedestal. According to this publication, deformation of the header is accompanied by a corresponding deformation of the flexible tube to thereby lessen the adverse influence which would be brought on the pressure sensor element. However, because of its nature, the flexible tube undergoes a deformation in correspondence with the external pressure introduced through the external pressure guiding pipe and, therefore, the pressure inside the evacuated compartment that is used as the reference pressure is apt to change, resulting in incapability of accomplishing an accurate measurement. In addition, repeated deformation of the header may eventually result in an undesirable separation of the flexible tube from the header.

SUMMARY OF THE INVENTION

Accordingly, the present invention has been devised to substantially eliminate the above discussed problems found in the prior art pressure sensors and is intended to provide an improved pressure sensor having a high durability against deformation of the head resulting from thermal expansion and/or shrinkage of the cap dependent on change in temperature.

To this end, the present invention provides a pressure sensor including a pressure sensor element, a pedestal having a through-hole defined therein for guiding an external pressure to the pressure sensor element and a header, all of which are successively tightly bonded together. The pressure sensor also includes a cap for covering the pressure sensor element and the pedestal and mounted tightly on the header. A region of the header ranging from a joint between the cap and the header to a joint between the pedestal and the header is stepped.

Preferably, the stepped region of the header referred to above a substantially cylindrical projection defined at a center portion of the header so as to protrude inwardly of the cap and having a diameter greater than the diameter of the through-hole, but smaller than the diameter of the imaginary circle that inscribes the pedestal. The pedestal is mounted atop and tightly joined with the cylindrical projection.

Alternatively, the stepped region of the header may be defined by an annular recess of a width which is equal to the difference between the diameter r1 of the imaginary circle, smaller than the incircle of the pedestal, and the diameter r2 of the imaginary circle larger than the circumcircle of the pedestal.

In either case, the header may have an undersurface formed with an annular groove of a diameter greater than that of the cylindrical projection and positioned inwardly of the joint between the header and the cap.

Also, a projection that define the thickness of the joint between the header and the pedestal may preferably be formed on either one of the header and the pedestal.

In addition thereto or separately therefrom, the header may have a cap receiving seat defined therein at a location lower than the level of the undersurface of the header, at which seat the cap is joined to the header.

According to the present invention, the stepped region of the header ranging from the joint between the cap and the header to the joint between the pedestal and the header is effective to lessen stresses applied to the joint between the header and the pedestal when the header is deformed as a result of thermal expansion and/or contraction due to change in temperature of the cap and is in turn effective to substantially avoid any possible change in operating characteristics of the pressure sensor element and any possible separation of the pedestal.

The presence of the cylindrical projection in the header is effective to provide a distance between the joint of the cap with the header and the joint of the header with the pedestal when the pedestal is mounted tightly on the cylindrical projection, so as to minimize the stresses which would be transmitted from the joint of the cap with the header to the joint of the header with the pedestal. Hence, the use of the cylindrical projection is advantageous in that the stresses which would be applied to the joint between the header and the pedestal when the header is deformed as a result of thermal expansion and/or contraction due to change in temperature of the cap can be lessened to thereby substantially avoid any possible change in operating characteristics of the pressure sensor element and any possible separation of the pedestal.

BRIEF DESCRIPTION OF THE DRAWINGS

The present invention will become readily understood from the following description of preferred embodiments thereof made with reference to the accompanying drawings, in which like parts are designated by like reference numeral and in which.

DESCRIPTION OF THE EMBODIMENTS

Figure 1:
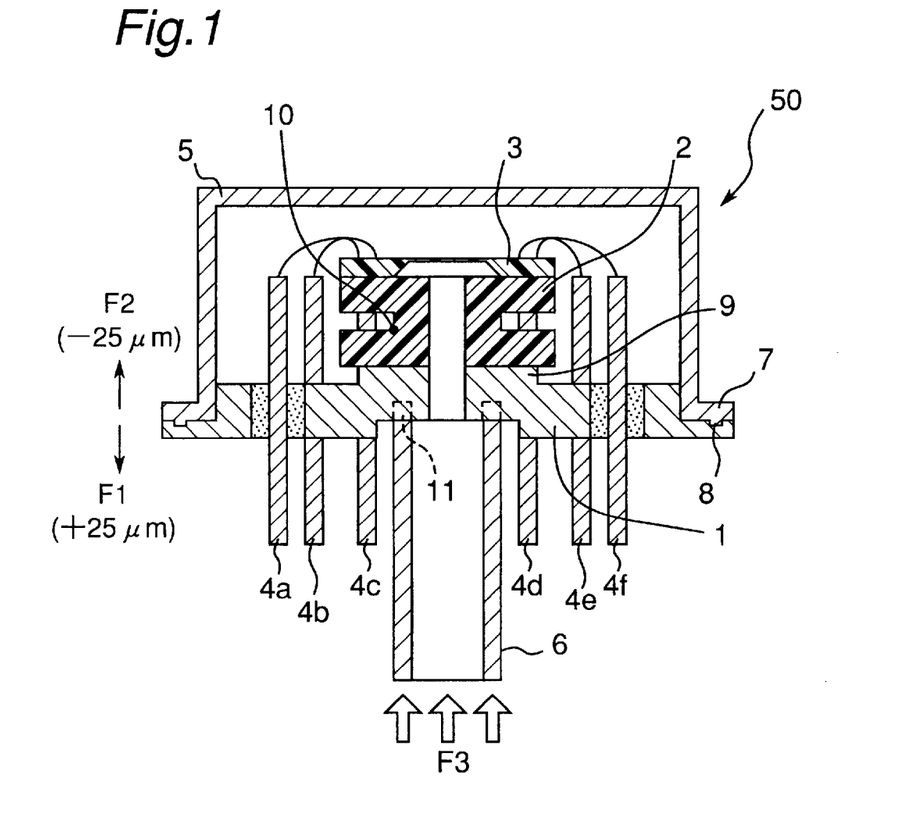
FIG. 1 is a schematic side sectional view of a pressure sensor according to a first embodiment of the present invention.
Figure 2:
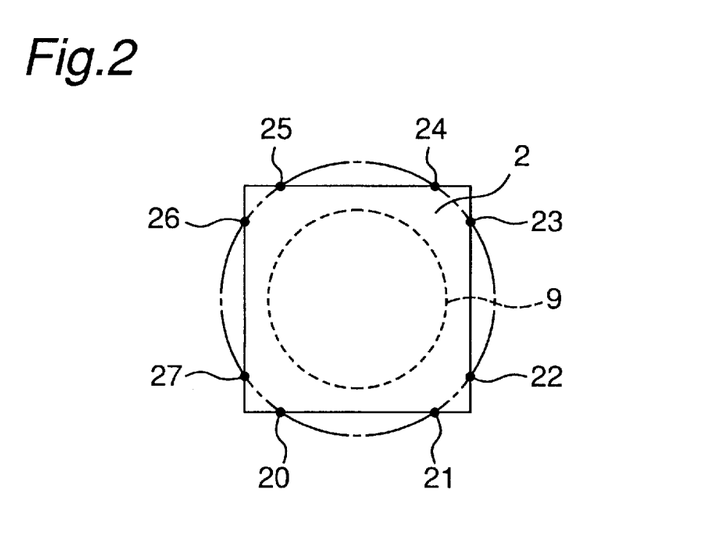
FIG. 2 is a schematic top plan view of a pedestal and a header both employed in the pressure sensor shown in FIG. 1.
Figure 3:
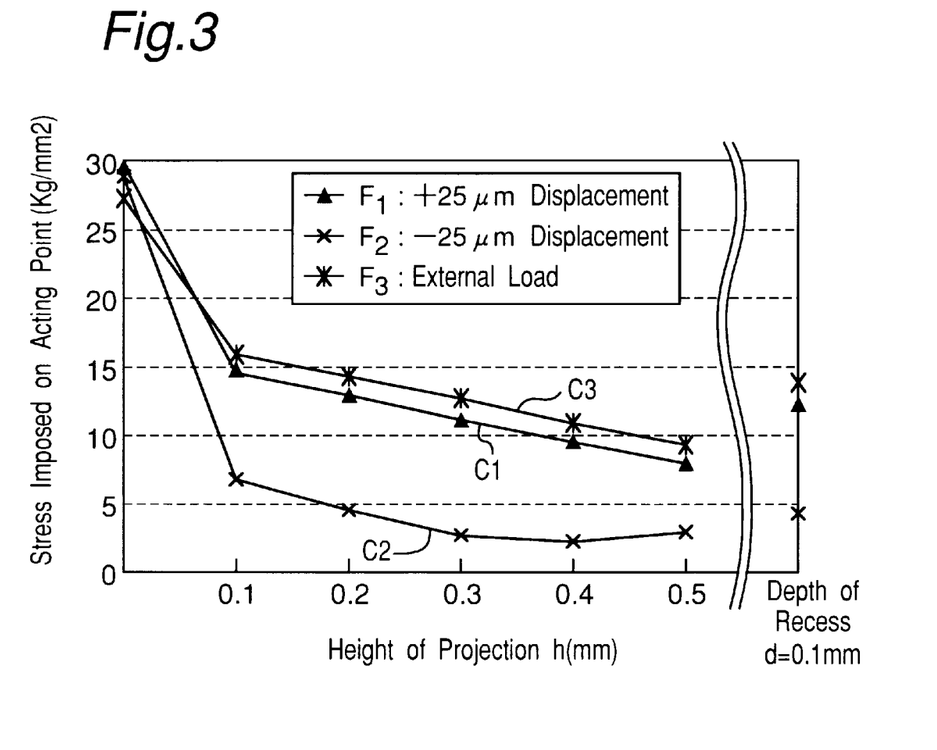
FIG. 3 is a graph showing a relationship between a varying height of a cylindrical projection in the pressure sensor and the stress built up in a silicon pedestal in the pressure sensor as a result of deformation of the header.

First Embodiment (FIGS. 1 to 3)

Referring to FIG. 1, a pressure sensor 50 according to a first embodiment of the present invention is shown therein. This illustrated pressure sensor 50 includes a disc-shaped header 1, 14.7 mm in diameter and 2.0 mm in thickness, formed with a cylindrical projection 9 of 4.2 mm in diameter and 0.5 mm in height by the use of any known press work. A generally square silicon pedestal 2, 4.7 mm ×4.7 mm in size, is mounted atop the cylindrical projection 9 and bonded thereto by means of an Au—Si bonding layer.

To enhance the bondability of the header 1 with the silicon pedestal 2, an 42 alloy having a coefficient of thermal expansion which is about equal to that of the silicon pedestal 2 is employed as a material for the header 1. The silicon pedestal 2 has an upper surface on which a pressure sensor element 3 is tightly bonded by the use of, for example, a die bonding technique. The pressure sensor element 3 is of a structure having a cavity defined therein so as to extend inwardly from an undersurface thereof to thereby leave an upper surface region which serves as a pressure receiving surface and, also, a generally annular body positioned radially outwardly of the cavity. The header 1 and the silicon pedestal 2 have respective through-holes of an equal diameter defined therein in a coaxial relation with each other and in communication with each other so as to guide an external pressure to the pressure receiving surface of the pressure sensor element 3.

The header 1 has an undersurface provided with an external pressure guiding pipe 6 secured thereto in a substantially coaxial relation with the respective through-holes in the header 1 and the silicon pedestal 2. To secure the guiding pipe 6 to the undersurface of the header 1, the header 1 may have an annular groove 11 defined in the undersurface thereof for receiving a corresponding end of the guiding pipe 6. Where the annular groove 11 is employed, the cylindrical projection 9 can have a height increased a distance corresponding to the volume of the annular groove 11 during the press work performed to form the cylindrical projection 9.

The pressure sensor element 3 has a plurality of electrode pads formed of "COBAL" (an alloy of cobalt and nickel), and electrodes 4a, 4b, 4c, 4d, 4e and 4f extending completely across the thickness of the header 1 with their respective opposite ends positioned inside and outside the pressure sensor are wire-bonded with the associated electrode pads on the pressure sensor element . 3.

A cap 5 covering both of the silicon pedestal 2 and the pressure sensor element 3 is made of SPC (a cold-rolled steel plate) and is of a configuration including an annular flange 7 protruding radially outwardly from an open end of a cylindrical body of the cap 2. An annular undersurface of the annular flange 7 facing towards the header 1 is formed with an annular axial protrusion 8. This cap 5 is tightly mounted on the header 1 with the annular protrusion 8 in the flange 7 welded to an outer peripheral portion of the header 1.

In the pressure sensor 50 of the structure described above, the cylindrical projection 9 is effective to provide a distance of separation between a portion of the header 1, where stresses are apt to develop as a result of alternating thermal expansion and contraction of the cap 5 induced by change in temperature, that is, a welded junction of the cap 5 with the header 1, and an Au—Si joint of the silicon pedestal 2 with the header 1. In other words, because of the presence of the cylindrical projection 9 in the header 1, that portion of the header 1 can be separated a substantial distance from the welded junction of the cap 5 with the header, to thereby minimize transmission of the stresses from the welded junction 1 to the Au—Si junction. Accordingly, any possible change in operating characteristics of the pressure sensor element 3 which would be caused by deformation of the header 1 resulting from alternating thermal expansion and contraction of the cap 5 incident to change in temperature and, also, any possible separation of the silicon pedestal 2 from the header 1 can effectively be avoided.

FIG. 2 illustrates the cylindrical projection 9 and the silicon pedestal 2 both viewed from top of the pressure sensor 50. As shown therein, the cylindrical projection 9 represents a round cross-sectional shape in order for a force, developed as a result of deformation of the header 1, to be distributed uniformly.

If as shown by the single-dotted chain line in FIG. 2 the cylindrical projection 9 has an outer diameter chosen to be greater than the diameter of the imaginary circle inscribing a bottom surface of the square-sectioned silicon pedestal 2, but smaller than the imaginary circle circumscribing the bottom surface of the silicon pedestal 2, specific points 20 to 27 will be created in the Au—Si junction at which concentration of the force developed as a result of deformation of the header 1 takes place. Once they are developed, there is the possibility that the silicon pedestal will separate from the header 1, that separation having been initiated from those specific points 20 to 27.

By the reason discussed above, the outer diameter of the cylindrical projection 9 as shown by the broken circle is preferably chosen as to be smaller the imaginary circle inscribing the square bottom surface of the silicon pedestal 2, but greater than the diameter of the through-hole defined in the silicon pedestal 2.

Referring to the graph shown in FIG. 3, a curve C1 is illustrative of the relationship between the height h, expressed in terms of millimeter, of the cylindrical projection 9 and the stress (Kg/cm$^2$) acting on the point 10 of the silicon pedestal 2, in the event that a force F1 of a magnitude sufficient to deform the header 1 so as to be convexed 25 $\mu$m outwardly is applied to a peripheral region of the header 1. A curve C2 in FIG. 3 is illustrative of the relationship between the height h, expressed in terms of millimeter, of the cylindrical projection 9 and the stress (Kg/cm$^2$) acting on the point 10 of the silicon pedestal 2, in the event that a force F2 of a magnitude sufficient to deform the header 1 so as to be concaved 25 $\mu$m is applied to a peripheral region of the header 1. On the other hand, a curve C3 in FIG. 3 is illustrative of the relationship between the height h, expressed in terms of millimeter, of the cylindrical projection 9 and the stress (Kg/cm$^2$) acting on the point 10 of the silicon pedestal 2, in the event that a force F3 corresponding to an external load of 10 kgf is applied to the guiding pipe 6.

Reviewing these curves C1 to C3 makes it clear that the stress acting on the point 10 of the silicon pedestal 2 decreases as the height h of the cylindrical projection 9 increases. Accordingly, in consideration of the physical strength of the cylindrical projection 9 after the latter has been formed by the use of the press work, the height h of the cylindrical projection 9 is preferably chosen to be within the range of 20 to 50% of the thickness of the header 1, although in the illustrated pressure sensor 50, the height h of the cylindrical projection 9 is chosen to be 0.5 mm.

Figure 4A:
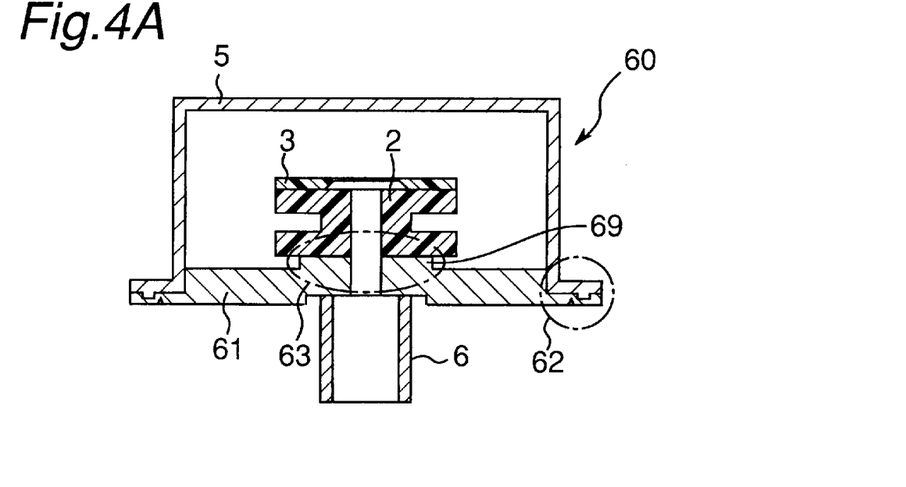
FIG. 4A is a schematic side sectional view of the pressure sensor according to a second embodiment of the present invention.
Figure 4B:
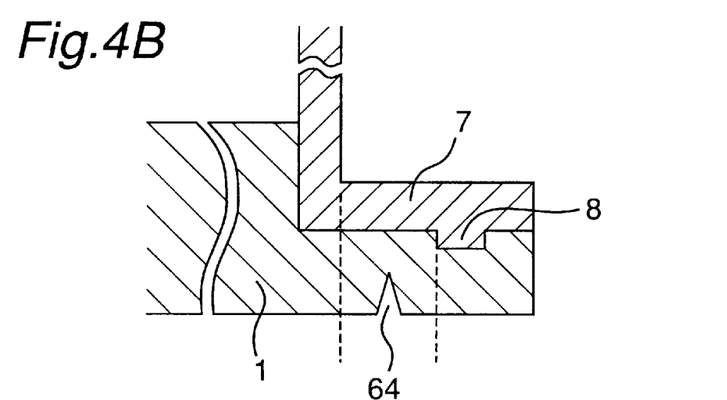
FIG. 4B is a fragmentary side sectional view showing a portion of the pressure sensor of FIG. 4A which is encompassed by the single-dotted circle shown in FIG. 4A.
Figure 4C:
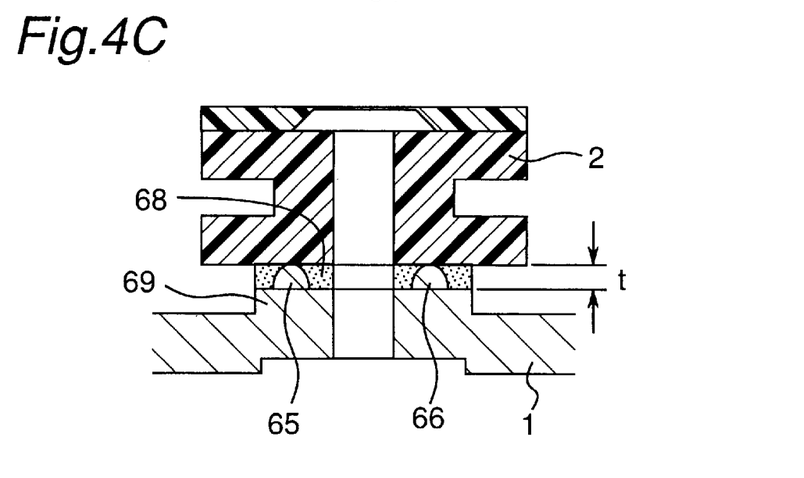
FIG. 4C is a fragmentary side sectional view showing another portion of the pressure sensor of FIG. 4A which is encompassed by the single-dotted ellipse shown in FIG. 4A.

Second Embodiment (FIGS. 4A to 4C)

Referring to FIGS. 4A to 4C, the pressure sensor, now identified by 60, is of a structure substantially similar to the pressure sensor 50, but differing therefrom in the following respects. As is the case with the pressure sensor 50, the pressure sensor 60 makes use of the header 61 having a cylindrical projection 69 of the same shape and the same size as those of the cylindrical projection 9 employed in the pressure sensor 60. It is to be noted that for the sake of brevity, electrodes such as those identified by 4a to 4f in the foregoing embodiment are not illustrated.

Referring particularly to FIG. 4B which illustrates an enlarged representation of a portion of the pressure sensor 60 which is encompassed by the single-dotted circle shown in FIG. 4A. As shown therein, the header 61 has an annular groove 64 defined in the undersurface thereof so as to extend inwardly thereof by the use of, for example, any known press work. This annular groove 64 has a diameter greater than the cylindrical projection 69, but smaller than the diameter of the imaginary circle along which a welding is effected to weld the cap flange 7 to the header 61.

The use of the annular groove 64 in the undersurface of the header 61 results in increase of the number of areas in the header 61 where abrupt change occurs, and accordingly, the stresses which would be developed at the Au—Si junction between the header 61 and the silicon pedestal 2 upon alternating thermal expansion and contraction of the cap 5 under the influence of change in temperature can be lessened. Thus, any possible change in operating characteristics of the pressure sensor element 3 which would be caused by deformation of the header 61 resulting from alternating thermal expansion and contraction of the cap 5 incident to change in temperature and, also, any possible separation of the silicon pedestal 2 from the header 61 can effectively be avoided.

In addition, as shown in FIG. 4C showing an enlarged representation of another portion of the pressure sensor which is encompassed by the single-dotted ellipse in FIG. 4A, the cylindrical projection 69 has an upper surface formed with at least three protruded seats 65, 66 and 67 (only the seat 67 being invisible) of a predetermined height t for the stable support thereon of the silicon pedestal 2. Specifically, the silicon pedestal 2 is mounted on the cylindrical projection 69 through the protruded seats 65 to 67 and is bonded thereto by mean of the Au—Si junction 68. In this embodiment a bonding layer forming the Au—Si junction 68 can have an increased thickness as compared with that in the foregoing embodiment. The height t of each of the protruded seats 65 to 67 is preferably chosen to be of a value sufficient to avoid any possible melt-flow of the bonding material, which eventually forms the Au—Si junction 68, and, also, any possible formation of voids in the Au—Si junction 68, for example, within the range of 5 to 15 $\mu$m.

While in the illustrated embodiment the protruded seats have been shown as formed on the cylindrical projection 69, they may be formed on a bottom surface of the silicon pedestal 2, or in part on the upper surface of the cylindrical projection 96 and in part on the bottom surface of the silicon pedestal 2. In addition, four or more protruded seats of an equal height may be employed, provided that the silicon pedestal 2 can be supported steadily. Alternatively, two or more line protuberances, either parallel or transverse to each other, may be employed in place of the illustrated protruded seats 65 to 67.

The Au—Si junction 68 function as a cushioning material effective to accommodate any possible deformation of the header 61. In the pressure sensor 60, the Au—Si junction 68 has a relatively large thickness so as to enhance the cushioning effect thereof as the cushioning material so that any possible change in operating characteristics of the pressure sensor element 3 which would be caused by deformation of the header 61 resulting from alternating thermal expansion and contraction of the cap 5 incident to change in temperature and, also, any possible separation of the silicon pedestal 2 from the header 1 can effectively be avoided.

Figure 5:
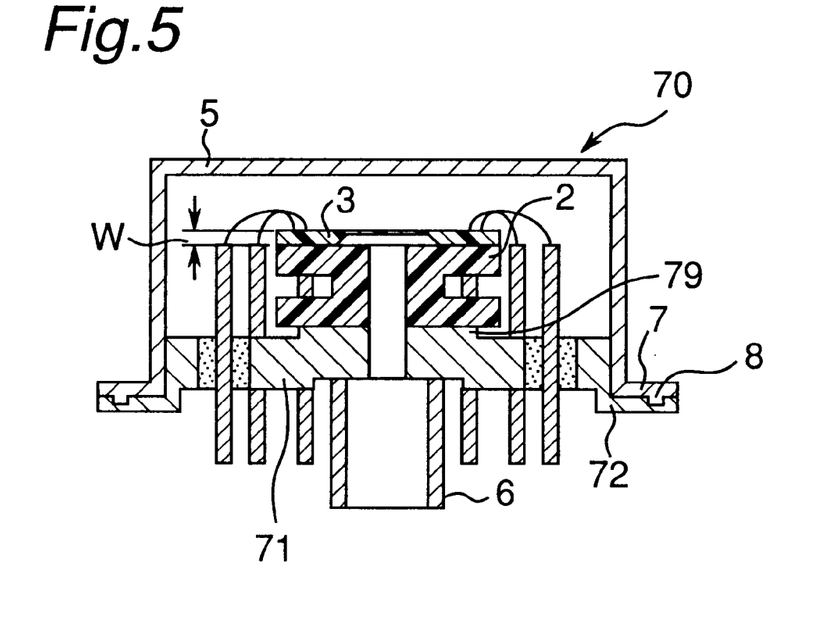
FIGS. 5 and 6 are schematic side sectional side views of the pressure sensor according to third and fourth embodiments of the present invention, respectively.

Third Embodiment (FIG. 5)

The pressure sensor, now identified by 70, is of a structure substantially similar to the pressure sensor 50 according to the first embodiment, but differing therefrom in the following respects. As is the case with the pressure sensor 50, the pressure sensor 70 makes use of the header 71 having a cylindrical projection 79 of the same shape and the same size as those of the cylindrical projection 9 employed in the pressure sensor 50.

To separate the welded junction between the header 71 and the cap 5 and the Au—Si junction between the cylindrical projection 79 a substantial distance away from the silicon pedestal 2, and vice versa, the cylindrical projection 79 has to have an increased height. However, since the cylindrical projection 79 is formed by the use of the press work, a side wall of the cylindrical projection 79 will be susceptible to reduction in physical strength and/or the step W between tops of the electrode 4a to 4f, where one ends of the wires are bonded, and electrode terminals on the pressure sensor element 3 where the opposite ends of the wires are bonded will become excessive, if the cylindrical projection 79 is too high. Specifically, the increased step W results in difficulty in accomplishing the intended wire bonding between the electrodes 4a to 4f and the electrode terminals on the pressure sensor element 3.

In view of the above discussed inconveniences, the cylindrical projection 9 employed in the pressure sensor 50 according to the first embodiment has been chosen to have a height of 0.5 mm.

However, in the pressure sensor 70 according to the third embodiment shown in FIG. 5, an outer peripheral region of the header 71 is provided with an annular counter-flange 72 protruding radially outwardly therefrom and positioned at a level below the body of the header 71. This annular counter-flange 72 can readily be formed by the use of any known press work, i.e., by pressing that outer peripheral region of the header 71 so as to set back a distance of 0.5 mm relative to the remaining portion of the header 71. The cap 5 in the third embodiment is capped onto the header 71 with the annular flange 7 welded or bonded to the annular counter-flange 72.

The provision of the annular counter-flange 72 is effective to increase the distance of separation from the welded junction between the cap 5 and the header 71, which is susceptible to the force of thermal expansion and contraction of the cap 5 incident to change in temperature, and the Au—Si junction between the cylindrical projection 79 and the silicon pedestal 2. Specifically, in this embodiment, the distance of separation corresponds to the sum of the height (0.5 mm) of the cylindrical projection 79 and the amount (0.5 mm) over which the counter-flange 72 has been set back relative to the remaining portion of the header 72.

The provision of the counter-flange 72 in the header 71 is effective to reduce the stresses which would be built up in the Au—Si junction as a result of the thermal expansion and contraction of the cap 5 incident to change in temperature, without the physical strength of the header 71 adversely affected and, also, without problems occurring in any other locations. Accordingly, any possible change in operating characteristics of the pressure sensor element 3 which would be caused by deformation of the header 71 resulting from alternating thermal expansion and contraction of the cap 5 incident to change in temperature and, also, any possible separation of the silicon pedestal 2 from the header 71 can effectively be avoided.

It is to be noted that the idea of providing the header with the annular groove 64 shown in FIG. 4B and/or the idea of providing either the header or the silicon pedestal with the protruded seats 65 to 67 shown in FIG. 4B to define the thickness of the junction between the header and the silicon pedestal may be equally applied to the pressure sensor 70.

Figure 6:
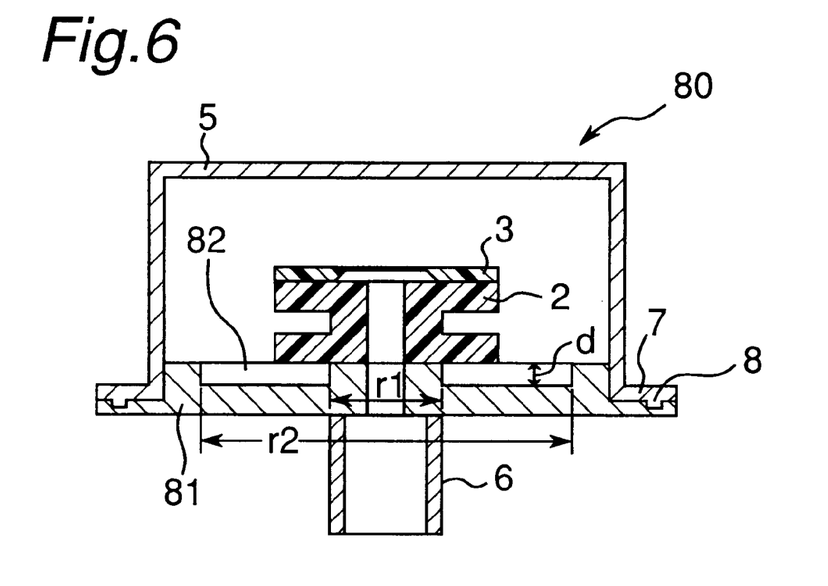

Fourth Embodiment (FIG. 6)

FIG. 6 illustrates, in a schematic side sectional representation, the pressure sensor 80 according to a fourth embodiment of the present invention. In this figure, the electrodes 4a to 4f shown in FIG. 1 are not illustrated for the sake of brevity.

According to the fourth embodiment, instead of the use of the cylindrical projection employed in any one of the foregoing embodiments, an annular recess 82 of a predetermined width is formed in the upper surface of the header 81. Specifically, an annular region of the upper surface of the header 81 that is encompassed outside the imaginary circle of a diameter r1 which may be 4.2 mm and which is smaller then the imaginary circle inscribing the silicon pedestal 2 and inside the imaginary circle of a diameter r2 which may be 7.4 mm and which is larger than the imaginary circle circumscribing the silicon pedestal 2 is concaved a depth d of 0.1 mm by the use of any known press work. Since the annular recess 82 renders the cross-sectional shape of the header 81 to be abruptly stepped, any possible change in operating characteristics of the pressure sensor element 3 which would be caused by deformation of the header 81 resulting from alternating thermal expansion and contraction of the cap 5 incident to change in temperature and, also, any possible separation of the silicon pedestal 2 from the header 81 can effectively be avoided.

The description made with reference to the graph of FIG. 3 can equally apply to the pressure sensor 80 of the structure shown in and described with reference to FIG. 6. Accordingly, the graph of FIG. 3 makes it clear that if the annular region of the upper surface of the header 81 outside the imaginary circle of the diameter r1, i.e., 4.2 mm, and inside the imaginary circle of the diameter r2, i.e., 7.4 mm is concaved to provide the annular recess 82 of the depth d of 0.1 mm, the stresses which would be built in at the point 10 of the silicon pedestal 2 can be reduced a quantity corresponding to that accomplished with the pressure sensor 50 of the first embodiment in which the header 1 is formed with the cylindrical projection 9 of 4.2 mm in diameter and 0.2 mm in height. Thus, the use of the annular recess 82 in the pressure sensor 80 is effective to avoid any possible change in operating characteristics of the pressure sensor element 3 which would be caused by deformation of the header 81 resulting from alternating thermal expansion and contraction of the cap 5 incident to change in temperature and, also, any possible separation of the silicon pedestal 2 from the header 81.

Similarly, the idea of providing the header with the annular groove 64 shown in FIG. 4B and/or the idea of providing either the header or the silicon pedestal with the protruded seats 65 to 67 shown in FIG. 4B to define the thickness of the junction between the header and the silicon pedestal may be equally applied to the pressure sensor 80. In addition, the idea of providing the header with the annular counter-flange 72 as shown in FIG. 5 can also be equally applied to the pressure sensor 80.

Although the present invention has been described in connection with the preferred embodiments thereof with reference to the accompanying drawings, it is to be noted that various changes and modifications are apparent to those skilled in the art. Such changes and modifications are to be understood as included within the scope of the present invention as defined by the appended claims, unless they depart therefrom.

What is claimed is:

1. A pressure sensor which comprises:

a pressure sensor element;

a pedestal having a through-hole defined therein for guiding an external pressure to the pressure sensor element, said pressure sensor element being tightly mounted on the pedestal; and a header, said pedestal being tightly mounted on the header; and a cap for covering the pressure sensor element and the pedestal and mounted tightly on the header so as to enclose the pressure sensor element and the pedestal;

wherein a region of the header ranging from a joint between the cap and the header to a joint between the pedestal and the header is stepped so as to form a projection inside said cap and a recess opposite said projection.

2. A pressure sensor which comprises:

a pressure sensor element;

a pedestal having a through-hole defined therein for guiding an external pressure to the pressure sensor element, said pressure sensor element being tightly mounted on the pedestal; and a header, said pedestal being tightly mounted on the header; and a cap for covering the pressure sensor element and the pedestal and mounted tightly on the header so as to enclose the pressure sensor element and the pedestal;

wherein a region of the header ranging from a joint between the cap and the header to a joint between the pedestal and the header is stepped; and wherein said region of the header is stepped to provide a substantially cylindrical projection defined at a center portion of the header so as to protrude inside the cap, said cylindrical projection having a diameter greater than a diameter of the through-hole, but smaller than a diameter of an imaginary circle that inscribes the pedestal.

3. A pressure sensor according to claim 2, wherein the header has an outer surface opposite to the cap, said outer surface having an annular groove formed therein, said annular groove being positioned radially inwardly of a joint between the cap and the header and having a diameter greater than a diameter of the cylindrical projection.

4. A pressure sensor which comprises:

a pressure sensor element;

a pedestal having a through-hole defined therein for guiding an external pressure to the pressure sensor element, said pressure sensor element being tightly mounted on the pedestal; and a header, said pedestal being tightly mounted on the header; and a cap for covering the pressure sensor element and the pedestal and mounted tightly on the header so as to enclose the pressure sensor element and the pedestal;

wherein a region of the header ranging from a joint between the cap and the header to a joint between the pedestal and the header is stepped; and wherein the header has an outer peripheral region set back a predetermined distance to a level below the remaining portion of the header to define an annular counter-flange where the cap is welded to the header.

* * * * *